US012369265B2

(12) United States Patent
Lv et al.

(10) Patent No.: US 12,369,265 B2
(45) Date of Patent: Jul. 22, 2025

(54) APPARATUS WITH CABLE CONSTRAINING DEVICE

(71) Applicant: ELO TOUCH SOLUTIONS, INC., Knoxville, TN (US)

(72) Inventors: XiaoMing Lv, Jiangsu (CN); Hui Yang, Jiangsu (CN); Wancheng Ji, Jiangsu (CN)

(73) Assignee: Elo Touch Solutions, Inc., Knoxville, TN (US)

( * ) Notice: Subject to any disclaimer, the term of this patent is extended or adjusted under 35 U.S.C. 154(b) by 0 days.

(21) Appl. No.: 18/004,490

(22) PCT Filed: Dec. 7, 2022

(86) PCT No.: PCT/US2022/081097
§ 371 (c)(1),
(2) Date: Jan. 6, 2023

(87) PCT Pub. No.: WO2023/108008
PCT Pub. Date: Jun. 15, 2023

(65) Prior Publication Data
US 2025/0024618 A1    Jan. 16, 2025

(30) Foreign Application Priority Data
Dec. 9, 2021  (CN) .......................... 202111494552.9

(51) Int. Cl.
*H05K 5/02*    (2006.01)
(52) U.S. Cl.
CPC ................................. *H05K 5/0247* (2013.01)
(58) Field of Classification Search
CPC ...... H05K 5/0247; H02G 15/007; H02G 3/32; H02G 3/02; H02G 11/00; H02G 11/02
See application file for complete search history.

(56) References Cited

U.S. PATENT DOCUMENTS 2,744,707 A * 5/1956 Peterson .................. H02G 7/10
174/41
3,346,688 A * 10/1967 Fields ....................... F16L 3/23
24/339

(Continued)

FOREIGN PATENT DOCUMENTS

JP        2012-64518 A      3/2012
WO    WO 2009/071652 A1    6/2009

OTHER PUBLICATIONS

International Search Report and Written Opinion for Application No. PCT/US22/81097 mailed Apr. 3, 2023, 6 pages.

*Primary Examiner* — David M Upchurch
(74) *Attorney, Agent, or Firm* — Sterne, Kessler, Goldstein & Fox P.L.L.C.

(57) ABSTRACT

The present disclosure relates to an apparatus with a cable constraining device. The apparatus Includes a housing and a cable Interface provided on the housing. The cable interface is able to connect to a cable. The cable constraining device includes a cable binding strap and a manipulation-assembly for manipulating the cable binding strap. The manipulation-assembly is configured to automatically tighten or loosen the cable binding strap. At least one pair of through holes are provided on the housing. The cable binding strap extends from a first through hole to a second through hole, passes through the first through hole from the inside of the housing to the outside of the housing and then through the second through hole from the outside of the housing to the inside of the housing. The cable binding strap can be extended around a cable outside the housing in order to constrain the cable.

20 Claims, 6 Drawing Sheets

(56) References Cited

U.S. PATENT DOCUMENTS

| | | | | |
|---|---|---|---|---|
| 3,495,025 | A | * | 2/1970 | Ross .................... D03D 15/593 |
| | | | | 174/117 M |
| 4,415,765 | A | * | 11/1983 | Iwasa .................... H01B 7/365 |
| | | | | 206/715 |
| 4,640,032 | A | * | 2/1987 | Lewis .................... H02G 3/26 |
| | | | | 40/660 |
| 10,734,134 | B2 | * | 8/2020 | Mizuno .................... H02G 3/30 |
| 2004/0065787 | A1 | | 4/2004 | Hardt et al. |
| 2005/0076479 | A1 | | 4/2005 | Rolla et al. |
| 2017/0210527 | A1 | * | 7/2017 | Breeling ................... F16B 2/08 |
| 2019/0044312 | A1 | | 2/2019 | MacGowan et al. |
| 2019/0287696 | A1 | * | 9/2019 | Mizuno .................... H01B 7/04 |
| 2021/0296875 | A1 | * | 9/2021 | Lee .................... B65H 75/4473 |
| 2022/0269027 | A1 | * | 8/2022 | Kukian .............. G02B 6/44775 |

* cited by examiner

APPARATUS WITH CABLE CONSTRAINING DEVICE

TECHNICAL FIELD

The present disclosure relates to the field of cable fixing technologies, and in particular, to an apparatus with a cable constraining device.

BACKGROUND ART

Currently, various electrical or electronic apparatuses are integrated with cables to transmit electrical energy and/or signals to the apparatuses by means of the cables. The cable needs to be firmly and reliably connected to the apparatus in order to maintain durable and reliable performance.

Therefore, it is desirable to take measures to prevent undesired loosening of cables due to long-term use and/or vibration of apparatuses.

In addition, it is also desirable to keep neat cable routing, because neat cable routing not only helps to improve an "appearance" of the apparatus, but also prevents faults such as misconnection caused by cable disorder.

CONTENT OF THE DISCLOSURE

A purpose of the present disclosure is to provide an apparatus with a cable constraining device that can overcome at least one defect in the prior art.

According to the present disclosure, an apparatus with a cable constraining device is provided. The apparatus comprises a housing and a cable interface provided on the housing, the cable interface being able to be connected with a cable; wherein the cable constraining device comprises a cable binding strap and a manipulation-assembly for manipulating the cable binding strap, and the manipulation-assembly is configured to automatically tighten or loosen the cable binding strap in response to a predetermined trigger signal to constrain or release at least one cable accordingly; wherein at least one pair of through holes, through which the cable binding strap can pass, are provided on the housing, each pair of through holes comprises a first through hole and a second through hole, and at least one cable extends in a space between the first through hole and the second through hole; wherein the cable binding strap is able to pass through the first through hole from the inside of the housing to the outside of the housing, and then pass through the second through hole from the outside of the housing to the inside of the housing after extending through the at least one cable on the outside of the housing, thereby forming a constraining contour surrounding the at least one cable on the outside of the housing.

In the apparatus of the present disclosure, the cable constraining device can be controlled to constrain or release the cable so that the cable is firmly held on the apparatus when the apparatus is running and the cable is released to be removed from the apparatus when it is required to maintain or transfer the apparatus. The cable constraining device can automatically constrain or release cables, especially a series of cables, preferably substantially synchronously, so as to keep neat and reliable cable routing. In addition, advantageously, the apparatus of the present disclosure can also reduce manpower consumption and improve operation efficiency.

Through the following detailed description of exemplary embodiments of the present disclosure with reference to the accompanying drawings, other features and advantages of the present disclosure will become apparent.

BRIEF DESCRIPTION OF THE DRAWINGS

The drawings constituting a part of the specification illustrate the embodiments of the present disclosure, and together with the specification, serve to explain the principle of the present disclosure.

Figure 1:
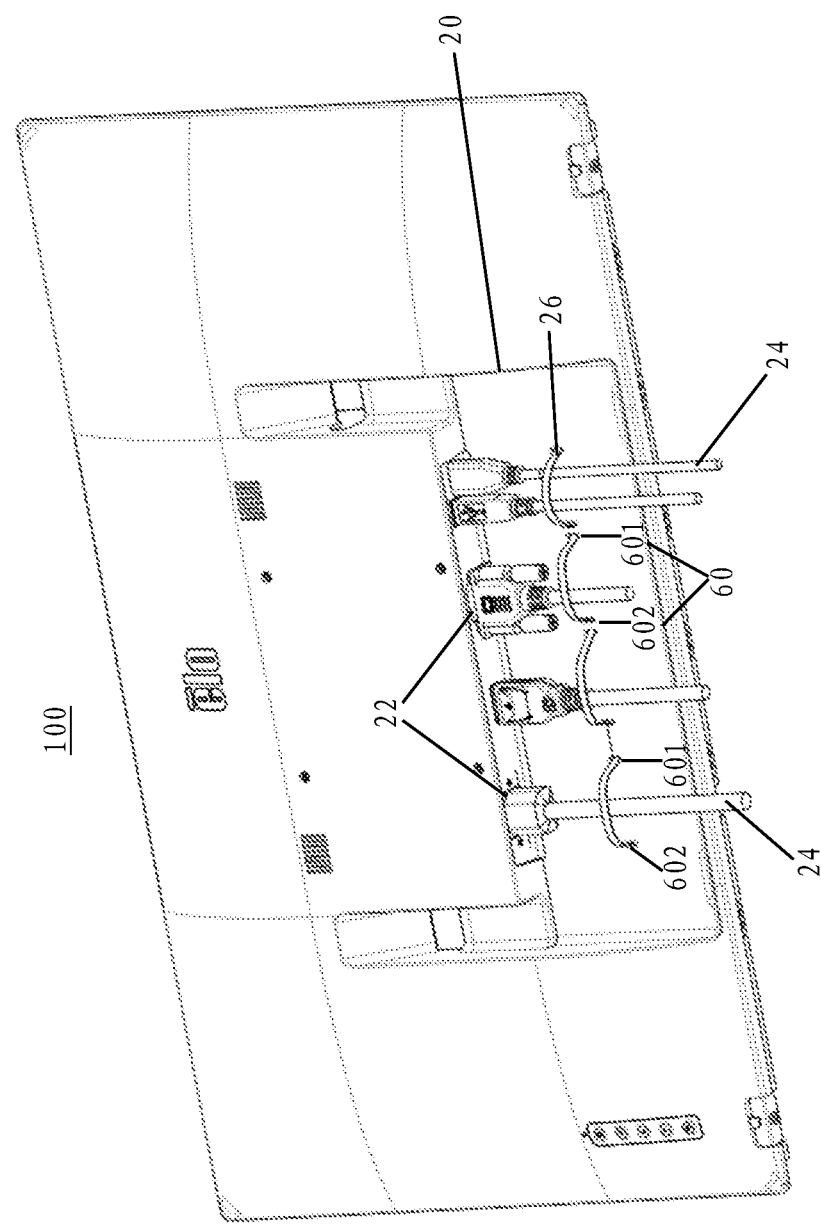
FIG. 1 is a schematic diagram of an apparatus according to some embodiments of the present disclosure with a cable constraining device in a releasing mode.

Note that in the embodiments described below, the same reference numeral is sometimes used in different drawings in common to denote the same portions or portions having the same functions, and description thereof is omitted. In some cases, similar reference numerals and letters are used to indicate similar items. Therefore, once an item is defined in one figure, it does not need to be further discussed in subsequent figures.

For ease of understanding, the position, size, range, etc. of each structure shown in the drawings and the like may not indicate the actual position, size, range, etc. Therefore, the present disclosure is not limited to the position, size, range, etc. disclosed in the drawings and the like.

EMBODIMENTS

Embodiments of the present disclosure will be described below with reference to the drawings, in which several embodiments of the present disclosure are shown. It should be understood, however, that the present disclosure may be implemented in many different ways, and is not limited to the example embodiments described below. In fact, the embodiments described hereinafter are intended to make the present disclosure to be more complete and to adequately explain the scope of the present disclosure to a person skilled in the art. It should also be understood that, the embodiments disclosed herein can be combined in various ways to provide many additional embodiments.

It should be understood that, the wording in the present disclosure is only used for describing particular embodiments and is not intended to limit the present disclosure. All the terms used in the specification (including technical and scientific terms) have the meanings as normally understood by a person skilled in the art, unless otherwise defined. For the sake of conciseness and/or clarity, well-known functions or constructions may not be described in detail.

In this document, when an element is referred to as being "disposed on", "attached to" another element, "connected to" another element, "coupled to" another element, or "contacting" another element, etc., the element may be directly disposed on another element, attached to another element, connected to another element, coupled to another element, or contacting another element, or an intermediate element may be present. In contrast, when it is described that an element is "directly disposed on" another element, "directly attached" to another element, "directly connected" to another element, "directly coupled" to another element, or "directly contacting" another element, there will be no intermediate element. In this context, when a feature is arranged as being "adjacent to" another feature, it means that the feature has a portion that overlaps this adjacent feature or a portion located above or below the adjacent feature.

In this document, elements or nodes or features that are "connected" together may be mentioned. Unless expressly stated, "connected" means that one element/node/feature can be directly or indirectly connected to another element/node/feature mechanically, electrically, logically or in other ways to allow interaction, even though these two features may not be directly connected. That is to say, "connected" is intended to include direct connection and indirect connection of elements or other features, including connection using one or more intermediate elements.

In this document, terms such as "upper", "lower", "left", "right", "front", "rear", "high", "low", etc. can explain the relationship between one feature and another feature in the drawings. It should be understood that, in addition to the orientation shown in the drawings, the terms of the spatial relationship also include different orientations of the device in use or operation. For example, when the device in the drawings is turned upside down, features that were originally described as being "below" other features may now be described as being "above" other features. The device can also be oriented in other ways (rotated by 90 degrees or in other orientations), and the relative spatial relationship will be explained accordingly.

The term "A or B" used through the present disclosure refers to "A and B" and "A or B" rather than meaning that A and B are exclusive, unless otherwise specified.

The term "exemplary", as used herein, means "serving as an example, instance, or illustration", instead of a "model" that will be copied exactly. Any implementation described herein as exemplary is not necessarily to be construed as preferred or advantageous over other implementations. Furthermore, there is no intention for the present disclosure to be bound by any expressed or implied theory presented in the part of technical field, the background art, the content of the disclosure or the embodiments.

In this document, the term "substantially" means to include any minor changes caused by design or manufacturing defects, device or component tolerances, environmental influences, and/or other factors. The term "essentially" also allows for differences from a perfect or ideal situation due to parasitic effects, noise, and other practical considerations that may be present in the actual implementation.

Besides, certain terminology, such as the terms "first", "second" and the like, may also be used in the following specification for the purpose of reference only, and it is thus not intended to be a limit. For example, the terms "first", "second" and other such numerical terms referring to structures or elements do not imply a sequence or order unless clearly indicated by the context.

Further, it should be noted that, the term "comprise/include/contain" as used herein specify the presence of stated features, steps, operations, unity, and/or components, but do not preclude the presence or addition of one or more other features, steps, operations, unities and/or components, and/or groups thereof.

The present disclosure proposes an apparatus with a cable constraining device. The apparatus may be an electronic apparatus, such as a touch-controlled apparatus or a self-service apparatus. In the apparatus, the cable constraining device can be controlled to constrain or release the cable so that the cable is firmly held on the apparatus when the apparatus is running and the cable is released to be removed from the apparatus when it is required to maintain or transfer the apparatus. The cable constraining device can automatically constrain or release cables, especially a series of cables, preferably substantially synchronously, thereby reducing manpower consumption and improving operation efficiency.

Next, with reference to FIG. 1 to FIG. 4, schematic diagrams of the apparatus 100 with the cable constraining device 10 in a releasing mode and a constraining mode in accordance with some embodiments of the present disclosure and that of a cable constraining device 10 in accordance with some embodiments of the present disclosure are in detail illustrated.

As an example, the apparatus 100 shown in the figures may be configured as an all-in-one (AiO) touch computer. Of course, the application of the apparatus 100 is not limited to this, but may be used in various occasions where cables 24 are involved or integrated, and the corresponding configuration of the apparatus 100 may also be changed according to the application occasion. The apparatus 100 according to various embodiments of the present disclosure may be used in various industries (for example, retail, catering, hotel, medical, entertainment, or transportation industries) for various purposes (for example, checkout (self-checkout), ticket printing, business handling, etc.). Common examples include self-service machines, bank self-service teller machines, supermarket self-checkout machines, hospital registration toll machines, self-service ticket machines, and so on.

Figure 2:
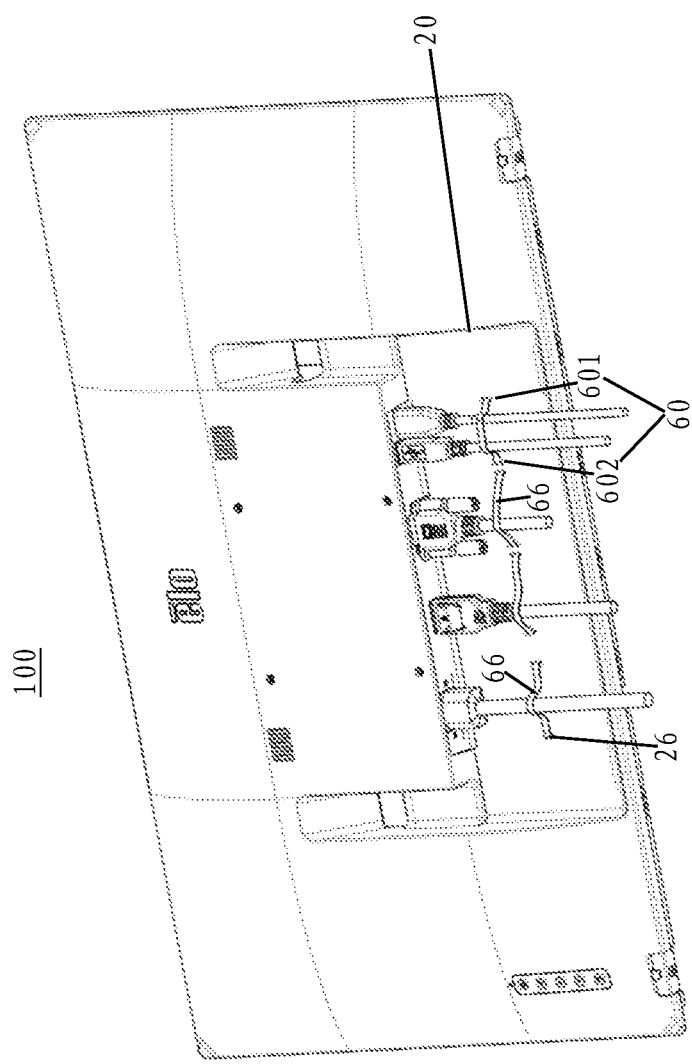
FIG. 2 is a schematic diagram of an apparatus according to some embodiments of the present disclosure with a cable constraining device in a constraining mode.

As shown in FIG. 1 and FIG. 2, the apparatus 100 may include a housing 20 and a plurality of cable interfaces 22 arranged on the housing 20, for example, arranged on a back side of the apparatus 100. Cables 24 for different purposes may be connected to each cable interface 22. For example, a power supply cable 24, a network cable 24 and/or a signal transmission cable 24 may be provided. For example, the signal transmission cable 24 may be configured to transmit signals of different types and purposes, such as control signals, multimedia signals (image signals, video signals, or voice signals, etc.), which is not further limited here. An operation interface, such as a touch-controlled interface, may be installed on a front side of the housing 20 for human-computer interaction operations. At the same time, the signals generated by the operation interface based on the human-computer interaction may also be transmitted to an interactive partner, such as a remote server, via a corresponding cable 24.

Although various cable routings improve the functionality of the apparatus 100, it also increases the difficulty of installation and maintenance, because it is desirable to maintain neat cable routings. The neat cable routing not only helps to improve an "appearance" of the equipment, but also prevents malfunctions such as misconnection caused by the disorder of the cables 24. Further, when the cable 24 is substantially vertically connected to a corresponding cable interface 22, undesired loosening of the cable 24 may easily occur due to factors such as vibration, movement, or gravity.

To this end, in the present disclosure, a cable constraining device 10 is integrated to the apparatus 100. The cable constraining device 10 may include a cable binding strap 26 and a manipulation-assembly 30 for manipulating the cable binding strap 26. The manipulation-assembly 30 may be configured to automatically tighten or loosen the cable binding strap 26 in response to a predetermined trigger signal, so as to constrain or release the cable 24 accordingly. In some embodiments, the predetermined trigger signal may be a predetermined voltage signal. For example, a first predetermined voltage signal may trigger a tightening mode of the manipulation-assembly 30, and a second predetermined voltage signal different from the first predetermined voltage signal may trigger a loosening mode of the manipulation-assembly 30. Different voltage signals may be switched by switching devices, for example. In some embodiments, the predetermined trigger signal may also be a predetermined voice signal, so that a mode switching operation may be implemented merely by voice control of an operator.

The cable constraining device 10 according to the present disclosure may not only maintain neat cable routing and avoid the disorder of the cable routing, but also make the cable 24 be firmly connected to the cable interface 22, thereby avoiding undesired loosening. Advantageously, the cable constraining device 10 according to the present disclosure may constrain or release corresponding cables 24 automatically, especially substantially synchronously, thereby improving installation efficiency and maintenance efficiency.

Figure 3:
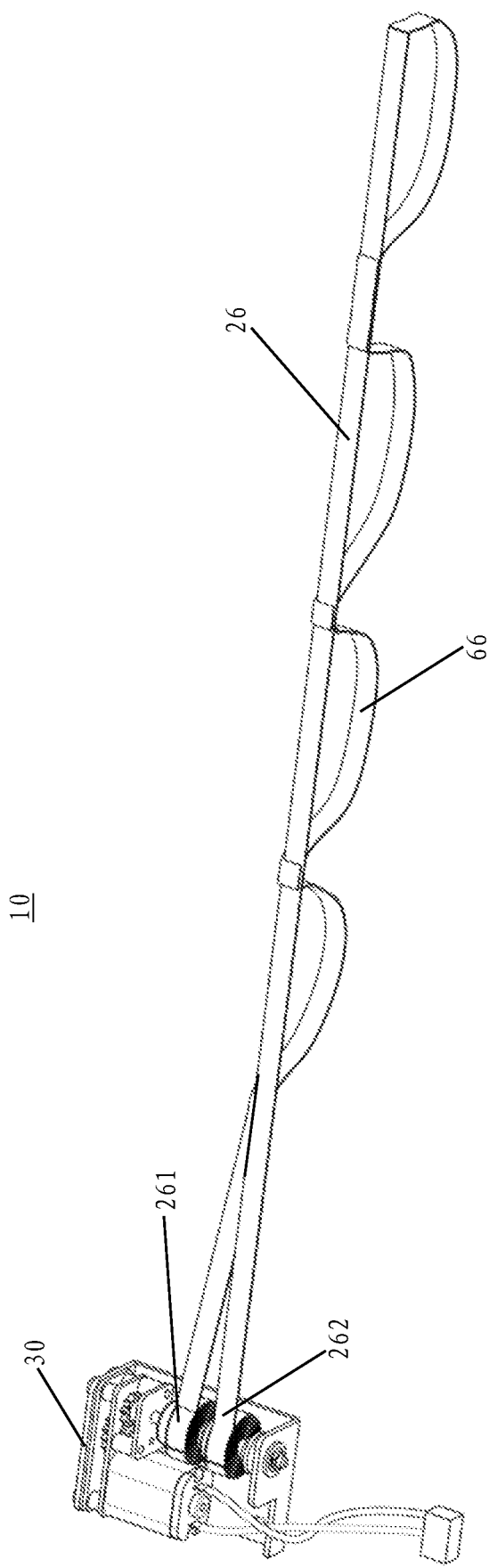
FIG. 3 is a schematic diagram of a cable constraining device according to some embodiments of the present disclosure.
Figure 4:
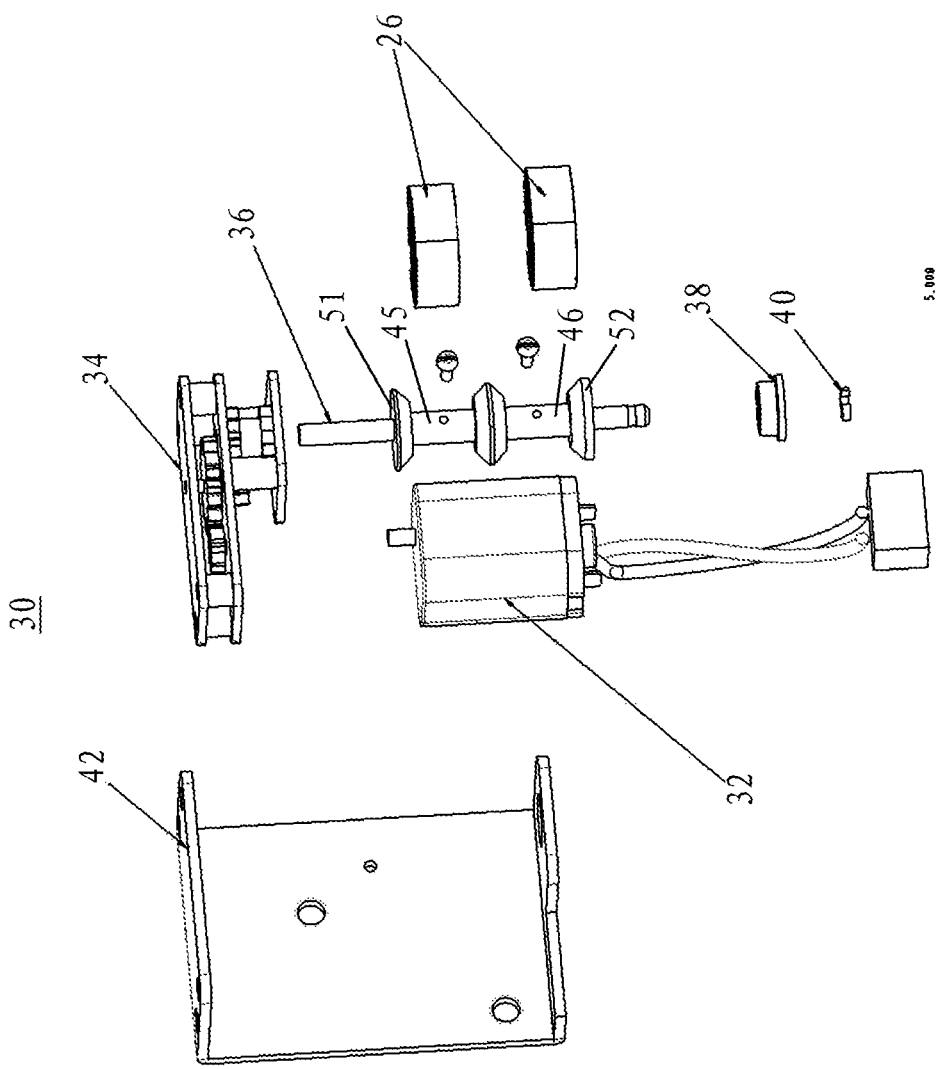
FIG. 4 is an exploded schematic diagram of a cable constraining device according to some embodiments of the present disclosure.

Referring to FIG. 3 and FIG. 4, schematic diagrams of a cable constraining device 10 in accordance with some embodiments of the present disclosure are illustrated. As an example, the manipulation-assembly 30 may be configured as an electric manipulation-assembly, which may include a drive motor 32 (e.g., a DC motor), a power supply which provides power to the drive motor 32, a reducer 34 which forms a transmission connection with the drive motor 32, and a rotating shaft 36 which forms a transmission connection with the reducer 34. The rotating shaft 36 may be supported on a bearing 38 at an end thereof and clamped by a clamping member 40. The drive motor 32, the reducer 34 and the rotating shaft 36 may be integrally mounted on a fixed frame 42. The cable binding strap 26 may be fixed on the rotating shaft 36 in the following manner, that is, a beginning end of the cable binding strap 26 is fixed on a first fixing section 45 by a first fastening means such as a screw and is wound on the first fixing section 45 to form a first binding strap roll 261, and an extremity end of the cable binding strap 26 is fixed on a second fixing section 46 by a second fastening means such as a screw and is wound on the second fixing section 46 to form a second binding strap roll 262. Therefore, a closed loop path of the cable binding strap 26 starting from the rotating shaft 36 (the first fixing section 45), passing through the respective cables 24, and returning to the rotating shaft 36 (the second fixing section 46) is realized.

In addition, first guide portions 51 may be formed on both sides of the first fixing section 45 on the rotating shaft 36, and the first guide portions 51 are assigned to the first binding strap roll wound on the first fixing section 45 to provide guidance for the winding or unwinding of the first binding strap roll on the first fixed section 45. Second guide portions 52 may be formed on both sides of the second fixing section 46 on the rotating shaft 36, and the second guide portions 52 are assigned to the second binding strap roll wound on the second fixing section 46 to provide guidance for the winding or unwinding of the second binding strap roll on the second fixed section 46.

In order to constrain the corresponding cables 24, the housing 20 may be provided with at least one pair of through holes 60 through which the cable binding strap 26 can pass. Each pair of through holes may include a first through hole 601 and a second through hole 602. At least one cable 24 may extend in a space between the first through hole 601 and the second through hole 602. The cable binding strap 26 may pass through the first through hole 601 from the inside of the housing 20 to the outside of the housing 20, and then pass through the second through hole 602 from the outside of the housing 20 to the inside of the housing 20 after extending through at least one cable 24 on the outside of the housing 20, thereby forming a constraining contour 66 surrounding the at least one cable 24 on the outside of the housing 20. The corresponding cable 24 may be constrained by tightening the constraining contour 66, and may be released by loosening the constraining contour 66.

Referring to FIG. 1 and FIG. 2, the housing 20 is provided with a plurality of pairs of through holes (four pairs of through-holes herein) through which the cable binding strap 26 can pass, each pair of the through holes may be assigned to at least one corresponding cable 24. Starting from the inside of the housing 20, the cable binding strap 26 may be guided through the plurality of pairs of through holes to form a plurality of constraining contours 66 for the respective cables 24 in the following way, that is, the cable binding strap 26 repeatedly passes through a corresponding first through hole 601 to the outside of the housing 20, and passes through a corresponding second through hole 602 to return to the inside of the housing 20 after extending through the at least one cable 24.

In FIG. 1 and FIG. 2, four constraining contours 66 are exemplarily shown, and each constraining contour 66 encloses one or more cables 24. The manipulation-assembly 30 may make the plurality of constraining contours 66 to be controlled to constrain or release the corresponding cables 24 by tightening or loosening the cable binding strap 26. For example, in an operating state of the apparatus, the manipulation-assembly 30 may tighten the cable binding strap 26 so that the plurality of constraining contours 66 are controlled to constrain the corresponding cables 24, while in a maintenance state or when the apparatus 100 needs to be transferred, the manipulation-assembly 30 may loosen the cable binding strap 26 so that the plurality of constraining contours 66 are controlled to release the corresponding cables 24 to allow the cables 24 to be removed from the corresponding cable interface 22.

In some embodiments, the cable constraining device 10 further includes a trigger device assigned to the drive motor 32, and the trigger device may be configured to generate a predetermined trigger signal for tightening or loosening the cable binding strap 26. As an example, the trigger device may be configured as a switching device or include a switching device. The switching device may be connected between the power supply and the drive motor 32 and configured to switch the operation modes of the drive motor 32, so that the drive motor 32 may be switched between a tightening mode and a loosening mode. For example, the switching device may be manually operated by the operator, such as pressing or flipping, so that in the tightening mode, the switching device causes the power supply to provide a positive voltage to the drive motor 32 to cause the drive motor 32 to rotate forwardly; and in the loosening mode, the switch device causes the power supply to provide a negative voltage to the drive motor 32 to cause the drive motor 32 to rotate reversely. In some embodiments, the trigger device may also be configured as a multi-level switch or include a multi-level switch, so as to generate a predetermined trigger signal for tightening or loosening the cable binding strap 26 in different degrees.

It should be understood that the design scheme of the trigger device may be diverse. In some embodiments, the trigger device may further include an evaluation unit assigned to the switching device, and the evaluation unit may control the operation of the switching device according to real-time data detected by sensors.

Alternatively, or additionally, the cable constraining device 10 may include a vibration sensor, which may detect a vibration degree of the apparatus. The evaluation unit may receive vibration parameters from the vibration sensor. When the vibration parameter is greater than a predetermined threshold value, the evaluation unit may control the switching device, so that the switching device causes the cable binding strap 26 to be tightened or to be tightened to a higher degree.

Alternatively, or additionally, the cable constraining device 10 may include a tension sensor, which may detect a tension force or a tightening degree of the cable binding strap 26, especially the tension force change curve over time. The evaluation unit may receive parameters from the tension sensor. When the tension is less than a predetermined threshold, the evaluation unit may control the switching device so that the switching device causes the cable binding strap 26 to be tightened to a higher degree.

In some embodiments, the cable constraining device 10 may further include a locking mechanism for locking the cable binding strap 26 after the cable binding strap 26 is tightened or loosened accordingly. The locking mechanism includes a locking portion for the rotating shaft for automatically locking the rotating shaft 36 after the cable binding strap 26 is tightened or loosened accordingly. After the locking mechanism locks the rotating shaft 36, the cable binding strap 26 is maintained in a predetermined tightening or loosening state, and the drive motor 32 may also be shut down at this time. This is not only conducive to energy saving, but also may reliably maintain the working state of the cable binding strap 26.

In some embodiments, for different extending sections of the cable 24, a plurality of cable binding strap 26 may be provided to constrain corresponding sections of the cable 24 specifically, so as to keep neat and robust routing of the cable 24 over a long extending range. To this end, the rotating shaft 36 may be formed to be elongated. A plurality of cable binding straps 26 spaced apart from each other may be arranged on the elongated rotating shaft 36. The respective cable binding straps 26 may be responsible for constraining or releasing different sections of the cable 24. When the manipulation-assembly 30 tightens the cable binding straps 26, the cable 24 is constrained by a corresponding constraining contour 66 on the front side and by the housing 20 on the rear side. Advantageously, the plurality of cable binding straps 26 may be simultaneously tightened by only one drive motor 32, which causes the plurality of cable binding straps 26 to constrain the respective cables 24 substantially synchronously in a plurality of sections, respectively.

Figure 5:
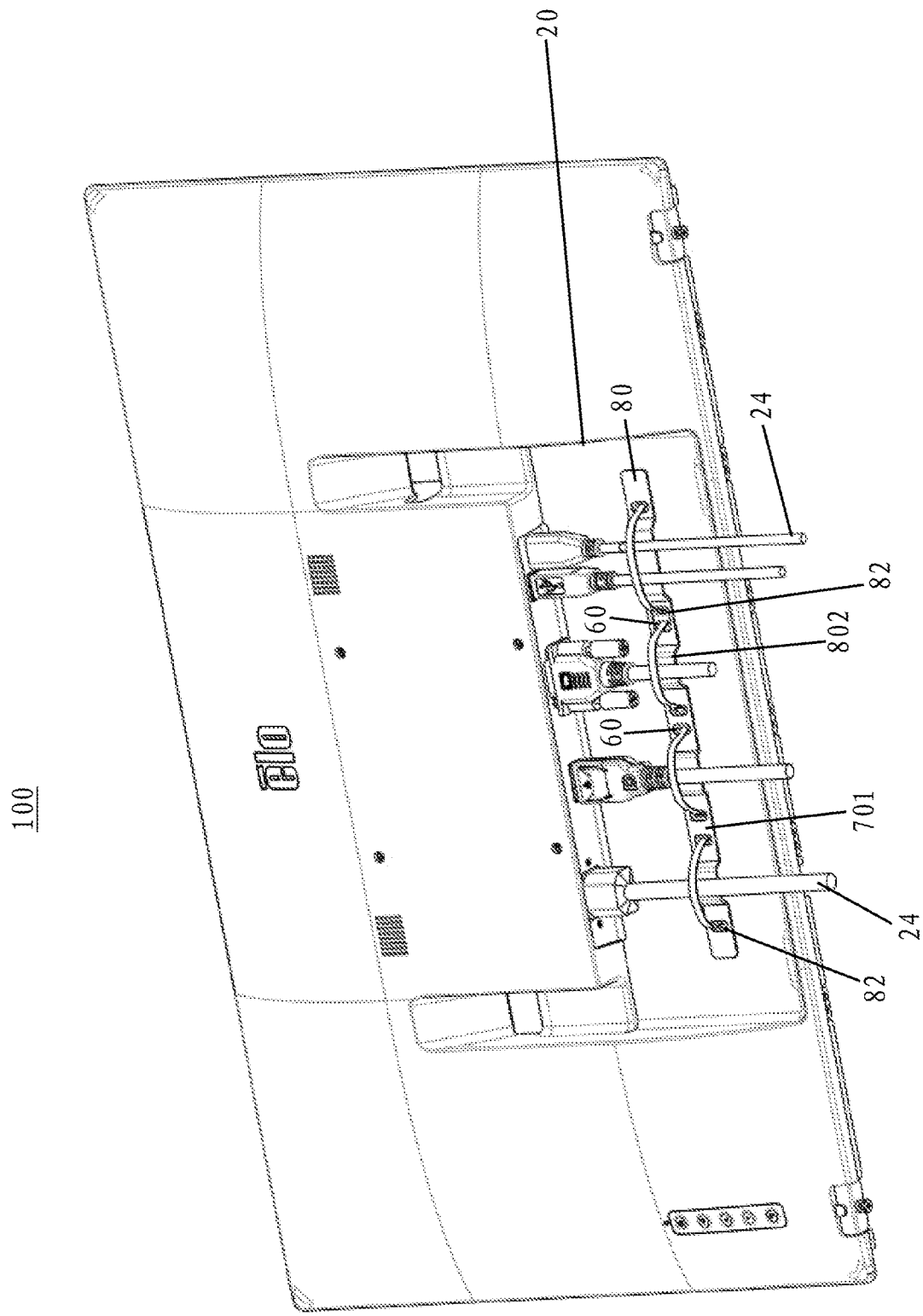
FIG. 5 is a schematic diagram of an apparatus according to some additional embodiments of the present disclosure with a cable constraining device in a releasing mode.
Figure 6:
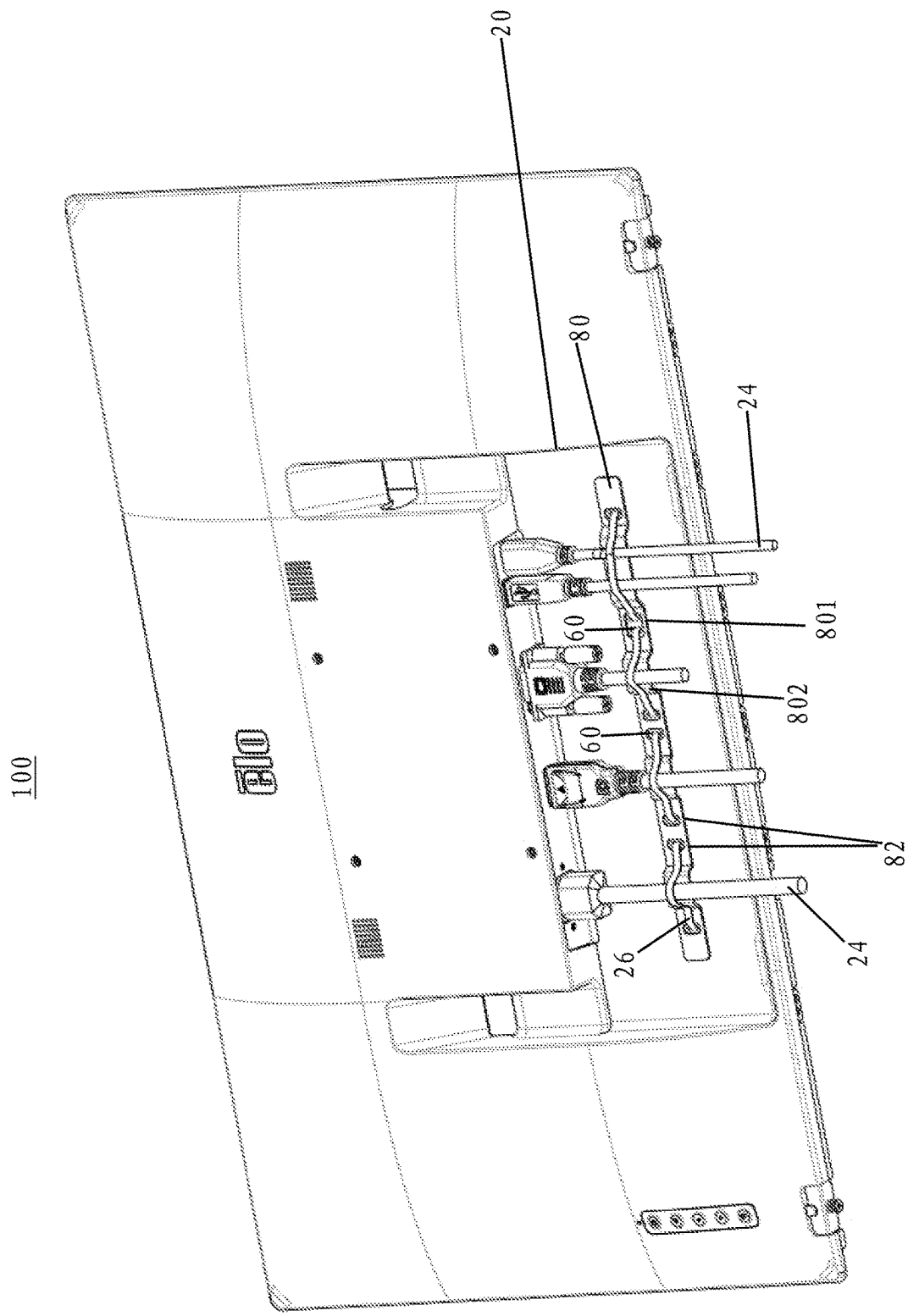
FIG. 6 is a schematic diagram of an apparatus according to some additional embodiments of the present disclosure with a cable constraining device in a constraining mode.

Now referring to FIG. 5 and FIG. 6, the apparatus 100 according to a further improved solution of the present disclosure is introduced, wherein FIG. 5 is a schematic diagram of the apparatus 100 with a cable constraining device 10 in a releasing mode, and FIG. 6 is a schematic diagram of the apparatus 100 with a cable constraining device 10 in a constraining mode.

As shown in FIG. 5 and FIG. 6, a supporting structure 80 for the at least one cable (here, multiple cables) is further installed on the housing 20. The supporting structure 80 may include a flat portion 801 and at least one boss portion 802 corresponding to a corresponding cable and protruding forward from the flat portion 801. In the current embodiment, the supporting structure may be configured as an integrated supporting bar, and a plurality of boss portions spaced apart from each other via flat portions may be provided in the integrated supporting bar. It should be understood that, in other embodiments, a plurality of supporting structures separated from each other may be installed on the housing.

Each boss portion on the supporting structure may be responsible for supporting one or more corresponding cables, so as to prevent the corresponding cable 24 from having torque or significantly bent when the cable 24 is constrained by the cable binding strap 26. The torque is undesirable because it may negatively affect the reliability and accuracy of the connection between the cable and the interface, and even cause the cable to loosen. In some cases, this undesired torque may further affect signal transmission performance in the cable. According to the current embodiment, the corresponding cable (especially when the cable binding strap 26 is tightened)—is supported by a boss portion in the rear and held on the boss portion stably, thereby preventing the cable from having torque due to being constrained by a corresponding constraining contour. It should be understood, that the dimension of the boss portion may be related to the number of cables to be supported, and as the number of cables to be supported increases, a length and/or width of the boss portion may be increased.

In order to form a corresponding constraining contour, the corresponding flat portion 801 of the supporting structure 80 may be provided with an opening 82 corresponding to the through hole 60 through which the cable binding strap 26 may pass, so that the cable binding strap 26 may pass through the corresponding through hole 60 and the opening 82 from the inside of the housing to the outside of the housing, and then pass through the corresponding through hole and the opening from the outside of the housing to the inside of the housing after extending through the at least one cable on the outside of the housing, thereby forming a constraining contour surrounding the at least one cable on the outer side of the housing. It should be understood that one opening may correspond to at least one through hole. In other words, one or more through holes may correspond to one or more openings. For example, when two or more through holes are close to each other, an opening with a larger size may be provided to cover these through holes.

In some embodiments, the flat portion 801 of the supporting structure may abut on a plane of the housing, and the boss portion 802 may protrude beyond the plane of the housing at a distance away from the plane of the housing (that is, gaps may be provided between the respective boss portions and the plane of the housing). The supporting surface of the boss portion may be basically close to or even abut on the peripheral surface of the cable, so as to allow the cable to be supported on the boss portion or at least to allow the cable to be supported on the boss portion when the cable binding strap is tightened.

In some embodiments, not only the flat portion 801 of the supporting structure but also the boss portion 802 of the supporting structure may abut on the plane of the housing. At this time, a thickness of the boss portion on the supporting structure may be significantly greater than a thickness of the flat portion, and the boss portion clearly protrudes from the plane of the housing, so as to allow the cable to be supported on the boss portion.

In some embodiments, the supporting structure may be configured as a metal supporting structure, such as an iron or copper supporting structure, and the supporting structure may be fixed on the housing by means of screw connection, welding or bonding.

Although some specific embodiments of the present disclosure have been described in detail through examples, those skilled in the art should understand that the above examples are only for illustration and not for limiting the scope of the present disclosure. The various embodiments disclosed herein can be combined arbitrarily without departing from the spirit and scope of the present disclosure. Those skilled in the art should also understand that various modifications can be made to the embodiments without departing from the scope and spirit of the present disclosure. The scope of the present disclosure is defined by the appended claims.

What is claimed is:

1. An apparatus with a cable constraining device, wherein the apparatus comprises a housing and a cable interface provided on the housing, the cable interface being able to be connected with a cable; wherein the cable constraining device comprises a cable binding strap and a manipulation-assembly for manipulating the cable binding strap, and the manipulation-assembly is configured to automatically tighten or loosen the cable binding strap in response to a predetermined trigger signal to constrain or release at least one cable accordingly; wherein at least one pair of through holes through which the cable binding strap can pass are provided on the housing, each pair of through holes comprises a first through hole and a second through hole, and at least one cable extends in a space between the first through hole and the second through hole; wherein the cable binding strap is able to pass through the first through hole from inside of the housing to outside of the housing, and then pass through the second through hole from the outside of the housing to the inside of the housing after extending through the at least one cable on the outside of the housing, thereby forming a constraining contour surrounding the at least one cable on the outside of the housing.

2. The apparatus with the cable constraining device according to claim 1, wherein a plurality of pairs of through holes, including the at least one pair of through holes, through which the cable binding strap can pass are provided on the housing, each pair of through holes are assigned to at least one cable respectively, and the cable binding strap passes through the plurality of pairs of through holes to form a plurality of constraining contours for respective cables.

3. The apparatus with the cable constraining device according to claim 2, wherein the manipulation-assembly tightens or loosens the cable binding strap so that the plurality of constraining contours are controlled to constrain or release the respective cables.

4. The apparatus with the cable constraining device according to claim 1, wherein the manipulation-assembly comprises a drive motor, a power supply for supplying power to the drive motor, a reducer that forms a transmission connection with the drive motor, and a rotating shaft that forms a transmission connection with the reducer, and the cable binding strap is fixed on the rotating shaft.

5. The apparatus with the cable constraining device according to claim 4, wherein the rotating shaft is provided with a first fixing section for a beginning end of the cable binding strap and a second fixing section for an extremity end of the cable binding strap.

6. The apparatus with the cable constraining device according to claim 5, wherein:
the beginning end of the cable binding strap is fixed on the first fixing section by a first fastening means and the cable binding strap is wound on the first fixing section to form a first binding strap roll; and
the extremity end of the cable binding strap is fixed on the second fixing section by a second fastening means and the cable binding strap is wound on the second fixing section to form a second binding strap roll.

7. The apparatus with the cable constraining device according to claim 6, wherein:
first guide portions are formed on both sides of the first fixing section on the rotating shaft, and the first guide portions are assigned to the first binding strap roll wound on the first fixing section; and
second guide portions are formed on both sides of the second fixing section on the rotating shaft, and the second guide portions are assigned to the second binding strap roll wound on the second fixing section.

8. The apparatus with the cable constraining device according to claim 4, wherein the cable constraining device further comprises a trigger device assigned to the drive motor, and the trigger device is configured to generate the predetermined trigger signal for tightening or loosening the cable binding strap.

9. The apparatus with the cable constraining device according to claim 8, wherein the trigger device is configured to generate the predetermined trigger signal for tightening or loosening the cable binding strap in different degrees.

10. The apparatus with the cable constraining device according to claim 8, wherein the trigger device is configured as a switching device or comprises the switching device, and the switching device is configured to switch an operating mode of the drive motor so that the drive motor is switched between a tightening mode and a loosening mode.

11. The apparatus with the cable constraining device according to claim 10, wherein the predetermined trigger signal is a predetermined voltage signal, and the predetermined voltage signal is switched by the switching device, wherein a first predetermined voltage signal triggers the tightening mode of the drive motor, and a second predetermined voltage signal, which is different from the first predetermined voltage signal, triggers the loosening mode of the drive motor.

12. The apparatus with the cable constraining device according to claim 9, wherein the cable constraining device comprises a vibration sensor and/or a tension sensor, and the trigger device generates predetermined trigger signals for tightening or loosening the cable binding strap in different degrees based on parameters from the vibration sensor and/or the tension sensor.

13. The apparatus with the cable constraining device according to claim 4, wherein the cable constraining device comprises a locking mechanism for locking the cable binding strap after the cable binding strap is tightened or loosened accordingly.

14. The apparatus with the cable constraining device according to claim 13, wherein the locking mechanism comprises a shaft locking portion for automatically locking the rotating shaft after the cable binding strap is tightened or loosened accordingly.

15. The apparatus with the cable constraining device according to claim 4, wherein a plurality of cable binding straps spaced apart from each other are arranged on the rotating shaft, and the plurality of cable binding straps are configured for constraining or releasing different sections of the cable, respectively.

16. The apparatus with the cable constraining device according to claim 1, wherein the at least one cable is constrained by a corresponding constraining contour on a front side and together by the housing on a rear side when the manipulation-assembly tightens the cable binding strap.

17. The apparatus with the cable constraining device according to claim 1, wherein the apparatus is a touch-controlled apparatus, the cable interface and the cable are disposed on a back side of the touch-controlled apparatus, and a front side of the touch-controlled apparatus is provided with a touch-controlled interface.

18. The apparatus with the cable constraining device according to claim 17, wherein the touch-controlled apparatus is a self-service apparatus.

19. The apparatus with the cable constraining device according to claim 1, wherein a supporting structure for the at least one cable is further installed on the housing, and the supporting structure comprises a flat portion and at least one boss portion corresponding to a corresponding cable and protruding forward from the flat portion, so that the corresponding cable is constrained by a corresponding constraining contour at a front of the cable and supported by the at least one boss portion at a rear of the cable.

20. The apparatus with the cable constraining device according to claim 19, wherein the flat portion of the supporting structure is provided with an opening, which corresponds to a through hole through which the cable binding strap passes, so that the cable binding strap passes through the corresponding through hole and the opening from the inside of the housing to outside of the housing, and then passes through the corresponding through hole and the opening from the outside of the housing to the inside of the housing after extending through the at least one cable on the outside of the housing.

* * * * *